United States Patent
Yamamoto

(10) Patent No.: US 8,089,566 B2
(45) Date of Patent: Jan. 3, 2012

(54) TELEVISION TUNER INTEGRATED CIRCUIT AND TELEVISION TUNER FOR ATTENUATING INTERFERENCE SIGNAL

(75) Inventor: Masaki Yamamoto, Fukushima-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 1293 days.

(21) Appl. No.: 11/788,266

(22) Filed: Apr. 19, 2007

(65) Prior Publication Data
US 2007/0252916 A1   Nov. 1, 2007

(30) Foreign Application Priority Data

Apr. 28, 2006  (JP) ................. 2006-125372

(51) Int. Cl.
H04N 5/50 (2006.01)
H04B 1/18 (2006.01)
H03J 1/00 (2006.01)

(52) U.S. Cl. ............ 348/731; 455/180.2; 455/188.2

(58) Field of Classification Search .......... 348/731, 348/707, 687; 455/179.1, 108.1, 180.2, 180.4, 455/303, 310, 188.2
See application file for complete search history.

(56) References Cited

U.S. PATENT DOCUMENTS

| | | | | |
|---|---|---|---|---|
| 3,571,723 A | * | 3/1971 | Ogusu | 455/190.1 |
| 4,025,857 A | * | 5/1977 | Miura | 455/180.2 |
| 4,048,598 A | | 9/1977 | Knight | |
| 4,127,820 A | * | 11/1978 | Beelitz et al. | 455/180.2 |
| 4,326,295 A | * | 4/1982 | Matsumoto et al. | 455/188.2 |
| 4,418,428 A | * | 11/1983 | Evans | 455/180.2 |
| 4,736,457 A | * | 4/1988 | Kupfer | 455/188.1 |
| 6,225,865 B1 | * | 5/2001 | Muterspaugh | 330/51 |
| 2003/0181177 A1 | | 9/2003 | Katagiri et al. | |

FOREIGN PATENT DOCUMENTS

| | | |
|---|---|---|
| DE | 198 19 544 | 11/1999 |
| DE | 198 39 857 | 3/2000 |
| EP | 0 952 667 | 10/1999 |
| EP | 1 492 243 | 12/2004 |
| GB | 2 052 198 | 1/1981 |
| JP | 61-39733 | 2/1986 |
| JP | 2002-368639 | 12/2002 |
| JP | 2003-234971 | 8/2003 |

OTHER PUBLICATIONS

European Search Report dated Sep. 3, 2007 from corresponding European Patent Application No. 07008659.0.

* cited by examiner

Primary Examiner — Victor Kostak
(74) Attorney, Agent, or Firm — Beyer Law Group LLP

(57) ABSTRACT

A tuner integrated circuit is connected, in a preceding stage thereof, to an RF amplifier including a UHF dual gate FET and a VHF dual gate FET. In the reception of a signal of the UHF band, a television signal output from the UHF dual gate FET is input to a UHF RF circuit via a UHF multiple-tuning circuit. In the reception of a signal of the VHF band, a television signal output from the VHF dual gate FET is input to a VHF RF circuit via a VHF multiple-tuning circuit. A VHF input terminal of the VHF RF circuit is connected to the ground via between a collector and an emitter of a transistor. In the reception of the signal of the UHF band, the transistor is turned on.

12 Claims, 3 Drawing Sheets

TELEVISION TUNER INTEGRATED CIRCUIT AND TELEVISION TUNER FOR ATTENUATING INTERFERENCE SIGNAL

CLAIM OF PRIORITY

This application claims benefit of the Japanese Patent Application No. 2006-125372 filed on Apr. 28, 2006, which is hereby incorporated by reference.

BACKGROUND OF THE INVENTION

1. Field of the Invention

The present invention relates to a television tuner integrated circuit including a high frequency circuit for a first band and a high frequency circuit for a second band, and to a television tuner including the integrated circuit.

2. Description of the Related Art

Conventionally, in a television tuner which receives a television signal of a VHF (Very High Frequency) band and a television signal of a UHF (Ultra High Frequency) band, an RF amplifier is provided to separately perform high frequency amplification on the television signal of the VHF band and the television signal of the UHF band. As an example of the RF amplifier, an RF amplifier has been proposed which includes a pair of dual gate FET amplifiers for individually amplifying the television signal of the VHF band and the television signal of the UHF band and a change-over switch for switching between the dual gate FETs to be actuated in accordance with the VHF band and the UHF band (see Japanese Unexamined Patent Application Publication No. 2002-368639, for example).

FIG. 3 is a configuration diagram of a television tuner including an RF amplifier unit capable of switching between dual gate FETs. A received television signal is input to a UHF antenna tuning circuit 101 and a VHF antenna tuning circuit 102 from a not-illustrated antenna. Output terminals of the UHF antenna tuning circuit 101 and the VHF antenna tuning circuit 102 are connected to an RF amplifier 200. A UHF output terminal 200a and a VHF output terminal 200b of the RF amplifier 200 are connected to a UHF multiple-tuning circuit 110 and a VHF multiple-tuning circuit 120, respectively. An output terminal of the UHF multiple-tuning circuit 110 and an output terminal of the VHF multiple-tuning circuit 120 are connected to UHF input terminals 301a and 301b and a VHF input terminal 302a of a tuner integrated circuit 300, respectively.

The RF amplifier 200 includes a UHF dual gate FET 201 having a first gate connected to the output terminal of the UHF antenna tuning circuit 101, a VHF dual gate FET 202 having a first gate connected to the output terminal of the VHF antenna tuning circuit 102, and a FET 203 for switching between the two dual gate FETs 201 and 202. A source of each of the UHF dual gate FET 201 and the VHF dual gate FET 202 is connected to the ground, and a drain of the UHF dual gate FET 201 and a drain of the VHF dual gate FET 202 are connected to the UHF output terminal 200a and the VHF output terminal 200b, respectively, to which a power supply voltage B is applied. Each of the UHF dual gate FET 201 and the VHF dual gate FET 202 is applied with an AGC voltage $V_{AGC}$ at a second gate thereof. The FET 203 has a source connected to the ground, a gate connected to the first gate of the UHF dual gate FET 201 via a resistor 204, and a drain connected to the first gate of the VHF dual gate FET 202 via a resistor 205 and also connected to the UHF output terminal 200a via a resistor 206. Details of the circuit configuration of the RF amplifier 200 are disclosed in the above-described publication.

The UHF output terminal 200a of the RF amplifier 200 is applied with the power supply voltage B via a series circuit formed by a feed resistor 111 and a choke inductor 112. A primary circuit of the UHF multiple-tuning circuit 110 is formed by a varactor diode 113 and an inductor 114. An intermediate connection point between the anode of the varactor diode 113 and the inductor 114, which is a high potential point, is coupled to the drain of the UHF dual gate FET 201 via a coupling capacitor 115. The cathode of the varactor diode 113 is grounded in terms of high frequency, and the other terminal of the inductor 114 is also grounded. Further, the cathode of the varactor diode 113 is applied with a tuning voltage. The primary circuit of the UHF multiple-tuning circuit 110 is M-coupled to a secondary circuit 116 of the UHF multiple-tuning circuit 110. The secondary circuit 116 is similar in configuration to the primary circuit.

The VHF output terminal 200b of the RF amplifier 200 is connected to a primary circuit of the VHF multiple-tuning circuit 120. The primary circuit of the VHF multiple-tuning circuit 120 is formed by a varactor diode 121 and inductors 122 and 123. An intermediate connection point between the cathode of the varactor diode 121 and the inductor 122, which is a high potential point, is coupled to the drain of the VHF dual gate FET 202. The anode of the varactor diode 121 is grounded, and the cathode of the varactor diode 121 is applied with a tuning voltage. The other terminal of the inductor 123 is grounded via a coupling capacitor 126. Further, the other terminal of the inductor 123 is applied with the power supply voltage B. To switch between a VHF low band and a VHF high band, an intermediate connection point between the inductors 122 and 123 is connected to the anode of a diode 124. The cathode of the diode 124 is grounded in terms of high frequency via a coupling capacitor 127. A secondary circuit 125 of the VHF multiple-tuning circuit 120 is M-coupled to the primary circuit of the VHF multiple-tuning circuit 120. The secondary circuit 125 is similar in configuration to the primary circuit.

The tuner integrated circuit 300 includes a UHF RF circuit 301 formed by, for example, a mixing circuit for performing frequency conversion on a received television signal of the UHF band, and a VHF RF circuit 302 formed by, for example, a mixing circuit for performing frequency conversion on a received television signal of the VHF band. The UHF RF circuit 301 is connected to the UHF input terminals 301a and 301b applied with a balanced output from the secondary circuit 116 of the UHF multiple-tuning circuit 110. The VHF RF circuit 302 is connected to the VHF input terminal 302a applied with an unbalanced output from the secondary circuit 125 of the VHF multiple-tuning circuit 120. Further, an external terminal 310 is applied with a direct current bias voltage Vcc. The external terminal 310 is connected to the UHF input terminal 301b via between a collector and an emitter of a transistor 311. A base of the transistor 311 is applied with a UHF band selection signal (BS4), which becomes high level when the UHF band is selected. A resistor 312 is provided between the emitter of the transistor 311 and the UHF input terminal 301b. A UHF/VHF switch line 314 is provided between the UHF input terminal 301b, which is applied with the direct current bias voltage Vcc via the transistor 311, and a UHF input terminal 200c of the RF amplifier 200. Further, the external terminal 310 applied with the direct current bias voltage Vcc is connected to an external terminal 322 via a resistor 321. The external terminal 322 is connected to the cathode of the diode 124 via a VHF multiple-tuning circuit switch line 324. The VHF multiple-tuning circuit switch line 324 is grounded via between a collector and an emitter of a transistor 323 provided in the tuner integrated circuit 300. A base of the transistor 323 is applied with a VHF high band selection signal (BS2), which becomes high level when the VHF high band is selected, and the UHF band selection signal (BS4).

Description will now be made of a UHF/VHF switching operation performed in the above-described television tuner. When the UHF band is selected, the transistor 311 is turned on, and the direct current bias voltage Vcc is applied to the UHF input terminal 200c of the RF amplifier 200 via the UHF/VHF switch line 314. Thereby, the UHF dual gate FET 201 is applied with the direct current bias voltage Vcc at the first gate thereof, and becomes capable of performing an amplifying operation. Meanwhile, the gate of the FET 203 is also applied with the direct current bias voltage Vcc, and the first gate of the VHF dual gate FET 202 is grounded via the FET 203. Accordingly, the first gate of the VHF dual gate FET 202 is applied with a voltage of 0 V, and becomes non-operational.

On the other hand, when the VHF band is selected, the UHF band selection signal (BS4) becomes low level. Thus, the transistor 311 is turned off, and the UHF input terminal 200c of the RF amplifier 200 is applied with the voltage of 0 V from the UHF/VHF switch line 314. Accordingly, the UHF dual gate FET 201 is applied with the voltage of 0 V at the first gate thereof, and becomes non-operational. Meanwhile, with the FET 203 turned off, the VHF dual gate FET 202 is applied with the power supply voltage B at the first gate thereof, and becomes capable of performing an amplifying operation. Further, when a high band of the VHF band is selected (and when the UHF band is selected), the VHF high band selection signal (BS2) becomes high level, and the cathode of the diode 124 is grounded. Accordingly, the diode 124 becomes conductive. Thus, the primary circuit of the VHF multiple-tuning circuit 120 resonates at a frequency in accordance with the inductor 122, and the VHF high band is selected. Meanwhile, when a low band of the VHF band is selected, the VHF high band selection signal (BS2) and the UHF band selection signal (BS4) both become low level, and the transistor 323 is turned off. Accordingly, the diode 124 becomes nonconductive. Thus, the primary circuit of the VHF multiple-tuning circuit 120 resonates at a frequency in accordance with the two series-connected inductors 122 and 123, and the VHF low band is selected. In the above-described manner, the diode 124 is turned on and off to switch between the VHF high band and the VHF low band.

In the tuner integrated circuit 300, however, the UHF input terminal 301a (301b) of the UHF RF circuit 301 and the VHF input terminal 302a of the VHF RF circuit 302 are disposed to be adjacent to each other. Thus, a parasitic capacitance Co exists between the input terminals. Therefore, when a signal of the UHF band is received, a VHF signal (VHF high band) corresponding to a half of the frequency of the UHF band enters the UHF RF circuit 301 via the parasitic capacitance Co to act as an interference signal.

SUMMARY OF THE INVENTION

The present invention has been made in view of the above issue, and provides a television tuner integrated circuit capable of attenuating an interference signal of a second band in the reception of a signal of a first band and thus capable of improving reception performance, and a television tuner including the integrated circuit.

A television tuner integrated circuit according to one aspect of the present invention is an integrated circuit connected, in a preceding stage thereof, to a first amplifying element to which a television signal of a first band is input and a second amplifying element to which a television signal of a second band different from the first band is input. The television tuner integrated circuit includes a first input terminal, a second input terminal, a first high frequency circuit for the first band, a second high frequency circuit for the second band, and a switching element. The television signal of the first band output from the first amplifying element is input to the first input terminal. The television signal of the second band output from the second amplifying element is input to the second input terminal, which is provided adjacently to the first input terminal. An input terminal of the first high frequency circuit is connected to the first input terminal. An input terminal of the second high frequency circuit is connected to the second input terminal. The switching element is provided between the second input terminal and the ground to ground the second input terminal in the reception of the television signal of the first band.

According to the above configuration, the switching element is provided to ground the second input terminal in the reception of the television signal of the first band. When the television signal of the first band is received, therefore, it is possible to substantially attenuate an interference signal of the second band flowing into the first input terminal from the second input terminal, which is adjacent to the first input terminal.

Further, according to another aspect of the present invention, in the above-described television tuner integrated circuit, the second input terminal may be applied with a predetermined voltage capable of turning on the second amplifying element.

According to the above configuration, the predetermined voltage for turning on the second amplifying element is applied to the second input terminal. Therefore, when an amplifier integrated circuit is of a type not including a switching circuit, if the second input terminal and the input terminal of the second amplifying element are connected to each other in terms of direct current, the second amplifying element can be turned on in the reception of the television signal of the second band. Further, in the reception of the television signal of the first band, in which the first amplifying element is turned on and the second amplifying element is turned off, if the second input terminal is grounded, the input terminal of the second amplifying element, which is connected to the second input terminal in terms of direct current, is also grounded. Thus, the second amplifying element can be turned off. That is, it is possible to achieve a television tuner integrated circuit which can employ an amplifier integrated circuit not including the switching circuit for switching to the first or second amplifying element. In the aforementioned conventional television tuner, the tuner integrated circuit 300 has a circuit configuration based on the assumption that the RF amplifier 200 includes the FET 203 for switching between the UHF and the VHF. When a dual FET amplifier not including the change-over switch (the FET 203) is employed, therefore, the change-over switch needs to be provided separately from the RF amplifier 200. As a result, the conventional example is increased in circuit size, and lacks versatility. According to the above aspect of the present invention, such issues can be solved.

A television tuner according to another aspect of the present invention includes the above-described television tuner integrated circuit. The television tuner includes an amplifier integrated circuit including, in a package, the first and second amplifying elements and a switching circuit for switching, in accordance with a received band, to the first or second amplifying element which should output the television signal. The amplifier integrated circuit is connected, in a subsequent stage thereof, to the television tuner integrated circuit.

According to the above configuration, it is possible to substantially attenuate the interference signal of the second band flowing into the first input terminal from the second input terminal, which is adjacent to the first input terminal, in the reception of the television signal of the first band.

A television tuner according to another aspect of the present invention includes the above-described television tuner integrated circuit. The television tuner includes an amplifier integrated circuit including the first and second amplifying elements but not including a switching circuit for switching between the first and second amplifying elements. The amplifier integrated circuit is connected, in a subsequent stage thereof, to the television tuner integrated circuit. The second input terminal and an input terminal of the second amplifying element are connected to each other in terms of direct current. In the reception of the television signal of the second band, the predetermined voltage applied to the second input terminal is applied to the input terminal of the second amplifying element to turn on the second amplifying element. In the reception of the television signal of the first band, the input terminal of the second amplifying element is grounded to turn off the second amplifying element.

According to the above configuration, the second input terminal and the input terminal of the second amplifying element are connected to each other in terms of direct current. Further, the predetermined voltage for turning on the second amplifying element is applied to the second input terminal. Therefore, the second amplifying element can be turned on in the reception of the television signal of the second band. Further, in the reception of the television signal of the first band, in which the first amplifying element is turned on and the second amplifying element is turned off, the second input terminal is grounded, and the input terminal of the second amplifying element, which is connected thereto in terms of direct current, is also grounded. Thus, the second amplifying element can be turned off.

The television tuner may be configured such that first band is a UHF band, and that the second band is a VHF band.

According to the present invention, it is possible to attenuate the interference signal of the second band in the reception of the signal of the first band, and thus to improve reception performance.

DESCRIPTION OF THE PREFERRED EMBODIMENTS

Embodiments of the present invention will now be described in detail with reference to the accompanying drawings.

Figure 1:
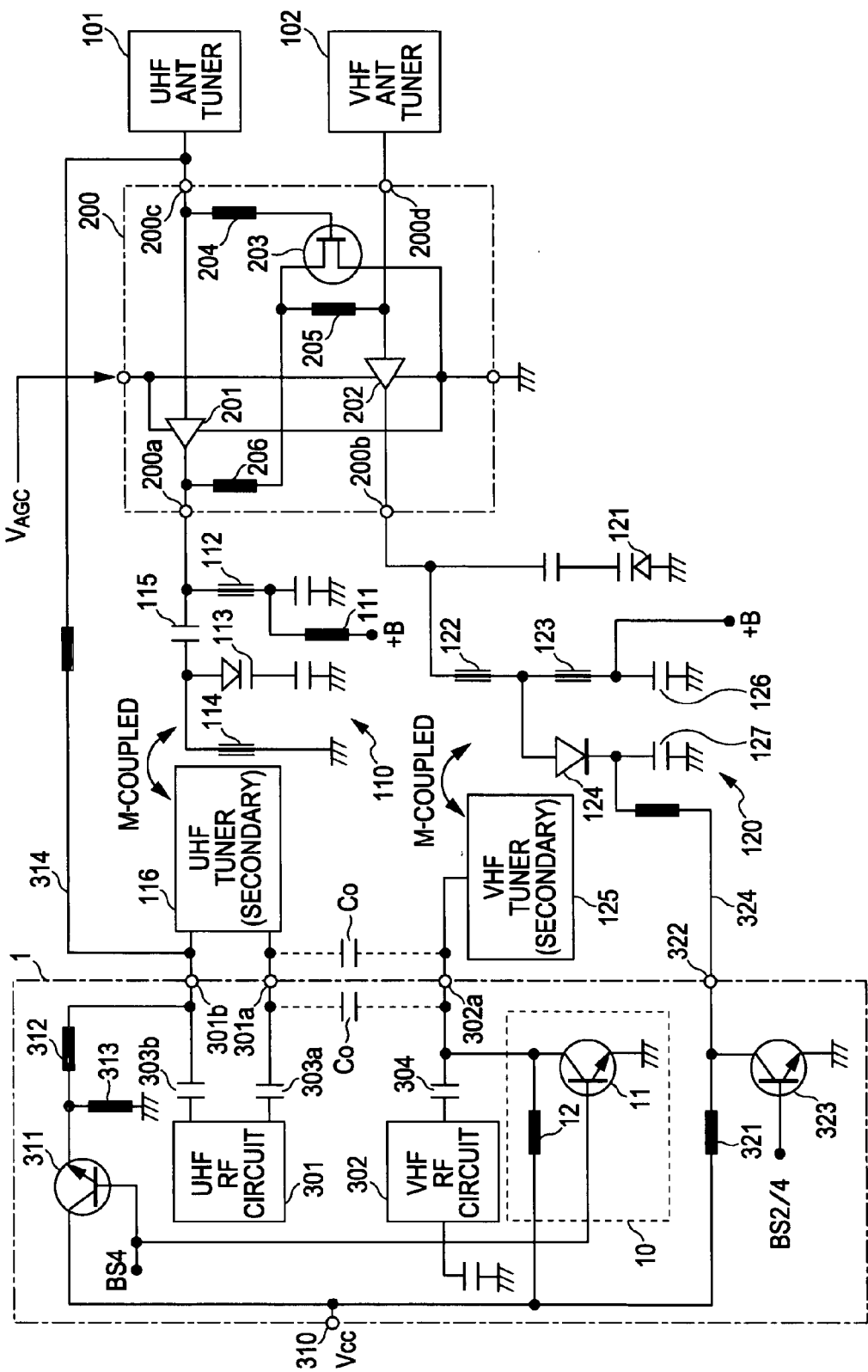
FIG. 1 is a configuration diagram of a television tuner according to an embodiment of the present invention.
Figure 3:
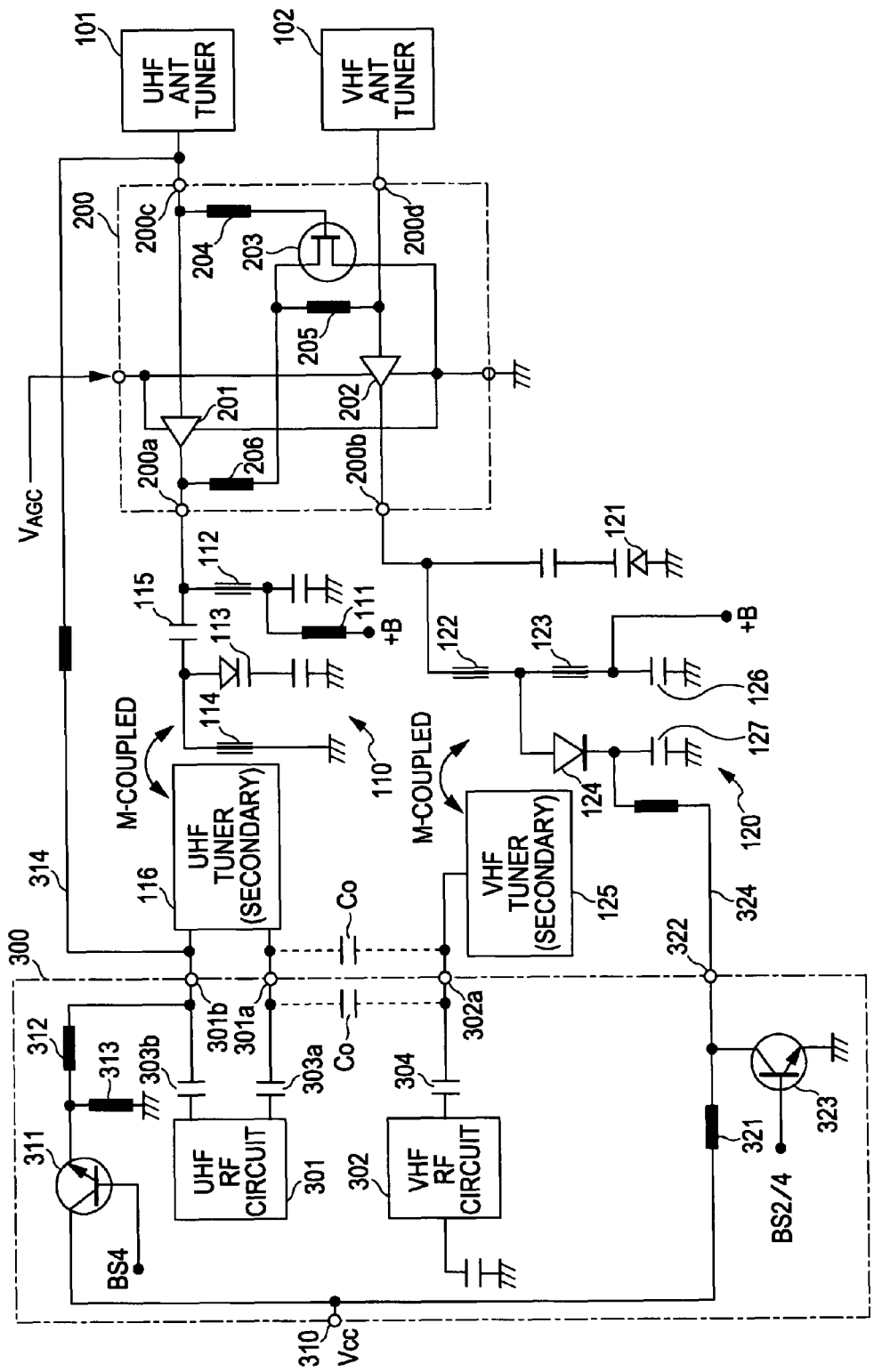
FIG. 3 is a configuration diagram of a conventional television tuner, which includes an RF amplifier including a change-over switch.

FIG. 1 is a configuration diagram of a television tuner according to an embodiment of the present invention. The components of the present embodiment the same as the components of the aforementioned television tuner illustrated in FIG. 3 will be denoted by the same reference numerals. The television tuner according to the present embodiment includes a tuner integrated circuit 1 having a function of attenuating an interference signal in the reception of a signal of the UHF band. The tuner integrated circuit 1 includes a switching circuit 10 for grounding the input terminal of the VHF RF circuit 302 in the reception of the signal of the UHF band and switching the input terminal of the VHF RF circuit 302 to an ungrounded state in the reception of a signal of the VHF band. The switching circuit 10 includes a transistor 11 for connecting the input terminal of the VHF RF circuit 302 to the ground via between a collector and an emitter of the transistor 11. The transistor 11 is configured such that the collector thereof is applied with the direct current bias voltage Vcc via a resistor 12, and that a base thereof is applied with the UHF band selection signal (BS4). Other configurations of the present embodiment are the same as the configurations of the television tuner illustrated in FIG. 3. That is, in the tuner integrated circuit 1, the UHF RF circuit 301 and the VHF RF circuit 302 are provided in addition to the above-described switching circuit 10, and the external terminal 310 applied with the direct current bias voltage Vcc is connected to the UHF input terminal 301b via between the collector and the emitter of the transistor 311. Further, the external terminal 310 is connected to the external terminal 322 of the tuner integrated circuit 1 via the resistor 321, and is grounded via between the collector and the emitter of the transistor 323. The base of the transistor 311 is applied with the UHF band selection signal (BS4), while the base of the other transistor 323 is applied with the VHF high band selection signal (BS2) and the UHF band selection signal (BS4). Further, the RF amplifier 200, which forms a dual FET amplifier functioning as an amplifier integrated circuit including a change-over switch, is disposed in a preceding stage of the tuner integrated circuit 1. Furthermore, the UHF output terminal 200a of the RF amplifier 200 is connected to the primary circuit of the UHF multiple-tuning circuit 110, while the VHF output terminal 200b of the RF amplifier 200 is connected to the primary circuit of the VHF multiple-tuning circuit 120. The output terminal of the secondary circuit 116 of the UHF multiple-tuning circuit 110 is connected to the UHF input terminals 301a and 301b of the tuner integrated circuit 1, while the output terminal of the secondary circuit 125 of the VHF multiple-tuning circuit 120 is connected to the VHF input terminal 302a of the tuner integrated circuit 1. Further, the UHF/VHF switch line 314 is provided to connect the UHF input terminal 301b to a preceding stage of the UHF input terminal 200c of the RF amplifier 200. Furthermore, the VHF multiple-tuning circuit switch line 324 is provided to connect the cathode of the diode 124 to the external terminal 322 of the tuner integrated circuit 1, at which the direct current bias voltage Vcc appears when the VHF low band is selected.

The operation of the thus configured present embodiment will now be described.

When the UHF band is selected, the UHF band selection signal (BS4) becomes high level. Thus, the transistor 311 is turned on, and conduction is established between the external terminal 310 applied with the direct current bias voltage Vcc and the UHF input terminal 301b. The direct current bias voltage Vcc is applied to the UHF input terminal 301b of the tuner integrated circuit 1, and is applied to the UHF input terminal 200c of the RF amplifier 200 via the UHF/VHF switch line 314. Accordingly, the UHF dual gate FET 201 is applied with the direct current bias voltage Vcc at the first gate thereof, and becomes capable of performing the amplifying operation.

Meanwhile, the FET 203 functioning as the change-over switch is also applied with the direct current bias voltage Vcc at the gate thereof via the resistor 204. Thus, the first gate of the VHF dual gate FET 202 is grounded via the FET 203. Accordingly, the VHF dual gate FET 202 is applied with the voltage of 0 V at the first gate thereof, and becomes non-operational. In the above-described manner, the UHF dual gate FET 201 is selected by the FET 203 in the RF amplifier 200.

The power supply voltage B is applied to the drain of the UHF dual gate FET 201 via the feed resistor 111 and the choke inductor 112, while a television signal of the UHF band is input to the first gate of the UHF dual gate FET 201 from the UHF antenna tuning circuit 101. The UHF dual gate FET 201 amplifies the television signal of the UHF band with a gain in accordance with the AGC voltage $V_{AGC}$ applied to the second gate thereof. From the amplified television signal of the UHF band, a television signal channel-selected by a tuning voltage is extracted in the UHF multiple-tuning circuit 110, and is supplied to the UHF input terminals 301a and 301b of the tuner integrated circuit 1. The UHF RF circuit 301 of the tuner integrated circuit 1 performs frequency conversion on the input television signal, and outputs the converted signal to a subsequent stage circuit.

In the switching circuit 10 of the tuner integrated circuit 1 in the above-described state, the base of the transistor 11 is applied with the UHF band selection signal (BS4), and conduction is established between the collector and the emitter of the transistor 11. When the UHF band is selected, therefore, the VHF input terminal 302a of the VHF RF circuit 302 is grounded via between the collector and the emitter of the transistor 11. Accordingly, the interference signal of the VHF high band corresponding to a half of the frequency of the UHF band is attenuated by the switching circuit 10. As a result, the inflow amount of the interference signal flowing into the UHF RF circuit 301 via the parasitic capacitance Co is substantially reduced.

When the VHF band is selected, the UHF band selection signal (BS4) becomes low level. Thus, the transistor 311 is turned off, and the external terminal 310 applied with the direct current bias voltage Vcc and the UHF input terminal 301b are cut off from each other. The UHF dual gate FET 201 is not applied with the direct current bias voltage Vcc at the first gate thereof, and does not perform the amplifying operation.

Meanwhile, with the FET 203 turned off, the VHF dual gate FET 202 is applied with the power supply voltage B at the first gate thereof via the feed resistor 111, the choke inductor 112, and the resistors 206 and 205. Accordingly, the VHF dual gate FET 202 becomes capable of performing the amplifying operation.

The power supply voltage B is applied to the drain of the VHF dual gate FET 202 via the inductors 123 and 122, while a television signal of the VHF band is input to the first gate of the VHF dual gate FET 202 from the VHF antenna tuning circuit 102. The VHF dual gate FET 202 amplifies the television signal of the VHF band with a gain in accordance with the AGC voltage $V_{AGC}$ applied to the second gate thereof. From the amplified television signal of the VHF band, a television signal channel-selected by a tuning voltage is extracted in the VHF multiple-tuning circuit 120, and is supplied to the VHF input terminal 302a of the tuner integrated circuit 1. The VHF RF circuit 302 of the tuner integrated circuit 1 performs frequency conversion on the input television signal, and outputs the converted signal to a subsequent stage circuit.

When the VHF high band is selected, the VHF high band selection signal (BS2) becomes high level. Thus, the transistor 323 of the tuner integrated circuit 1 is turned on. As a result, the diode 124 of the VHF multiple-tuning circuit 120 is grounded via a resistor, and thus becomes conductive. Therefore, the VHF multiple-tuning circuit 120 operates, without including the inductor 123. Thus, the VHF high band is selected. Meanwhile, when the VHF low band is selected, the VHF high band selection signal (BS2) and the UHF band selection signal (BS4) both become low level. Thus, the transistor 323 of the tuner integrated circuit 1 is turned off. The cathode of the diode 124 of the VHF multiple-tuning circuit 120 is applied with the direct current bias voltage Vcc via the VHF multiple-tuning circuit switch line 324. Thus, the diode 124 becomes nonconductive. As a result, the circuit of the VHF multiple-tuning circuit 120 is formed, with the inductors 122 and 123 connected in series. Therefore, the VHF multiple-tuning circuit 120 operates, including the inductor 123. Thus, the VHF low band is selected.

As described above, according to the present embodiment, the tuner integrated circuit 1 includes the switching circuit 10 which grounds the VHF input terminal 302a connected to the input terminal of the VHF RF circuit 302 to attenuate the interference signal of the VHF high band when the UHF band is selected. When the UHF band is selected, therefore, it is possible to substantially attenuate the interference signal flowing into the UHF RF circuit 301, and thus to suppress the interference to the signal of the UHF band.

In the television tuner illustrated in FIG. 1, the RF amplifier 200 forming the amplifier integrated circuit includes the FET 203 as the change-over switch. The present invention is also applicable to an RF amplifier (an amplifier integrated circuit) of a type not including the FET 203, as the change-over switch, in the package including the RF amplifier.

Figure 2:
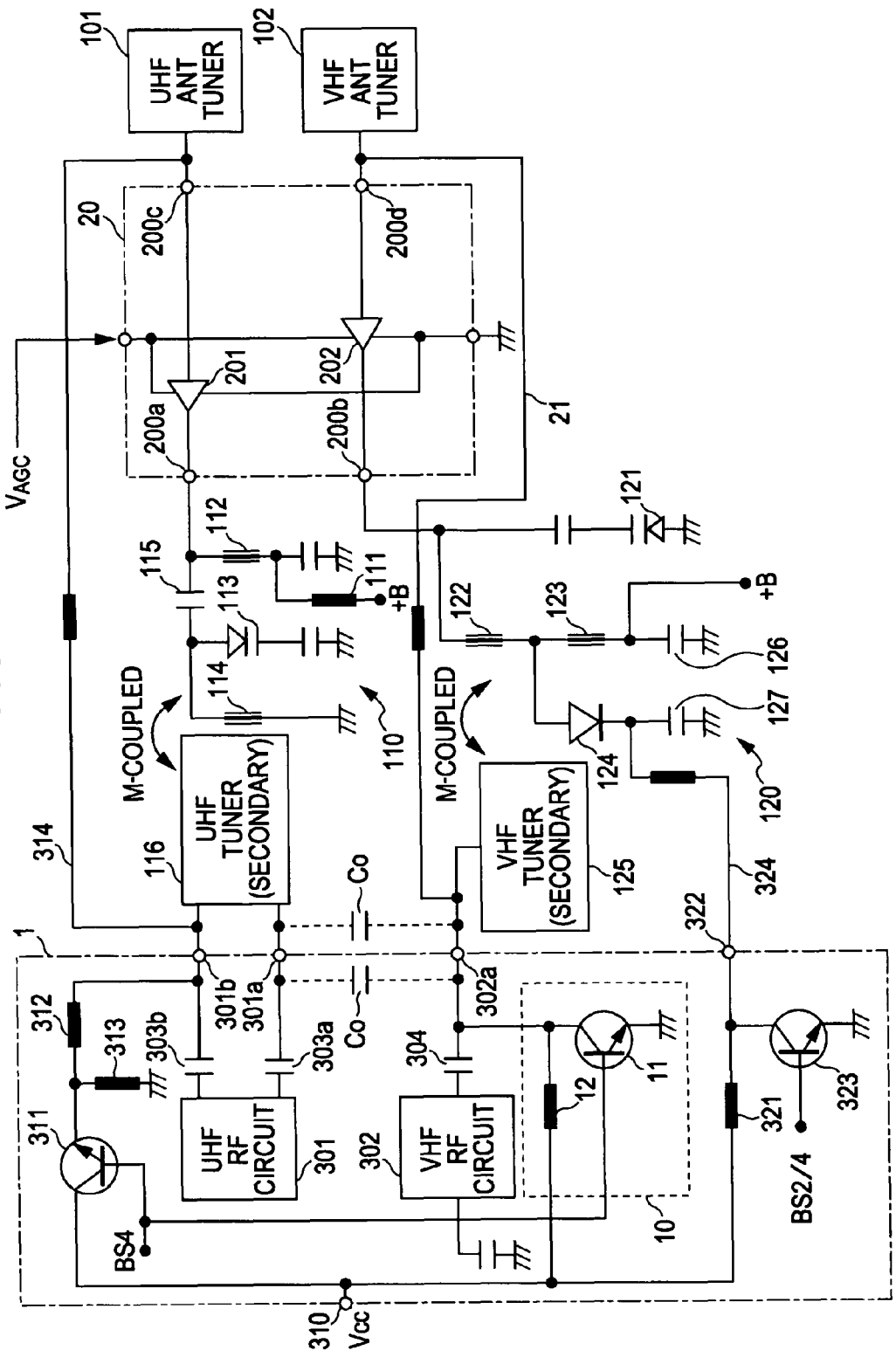
FIG. 2 is a configuration diagram of a television tuner according to an embodiment of the present invention, which includes an RF amplifier not including a change-over switch.

FIG. 2 illustrates a configuration example in which an amplifier integrated circuit (an RF amplifier) not including a change-over switch is applied to the above-described tuner integrated circuit 1. The components of the present example are the same as the components of the television tuner illustrated in FIG. 1 will be denoted by the same reference numerals. An RF amplifier 20 is a dual gate FET amplifier of a type not including a change-over switch, and is formed by the UHF dual gate FET 201 and the VHF dual gate FET 202.

In the present embodiment, a VHF RF amplifier selection line 21 is provided to connect the VHF input terminal 302a of the VHF RF circuit 302 to the input terminal of the VHF dual gate FET 202. Other configurations of the present embodiment are the same as the configurations of the television tuner illustrated in FIG. 1, except that the RF amplifier 20 is the type not including a change-over switch.

The operation of the thus configured television tuner will now be described.

When the VHF band is selected, the UHF band selection signal (BS4) becomes low level, and the transistor 11 is turned off. Thus, the direct current bias voltage Vcc is applied to the VHF input terminal 302a of the VHF RF circuit 302 via the resistor 12. The VHF input terminal 302a of the VHF RF circuit 302 is connected to one end of the VHF RF amplifier selection line 21. Thus, the direct current bias voltage Vcc is applied to the first gate of the VHF dual gate FET 202 via the VHF RF amplifier selection line 21. In the above state, the transistor 311 is nonconductive. Thus, the first gate of the UHF dual gate FET 201 is not applied with the direct current bias voltage Vcc. As a result, the VHF dual gate FET 202 is selected.

When the UHF band is selected, the UHF band selection signal (BS4) becomes high level, and the transistor 11 is turned on. Thus, the direct current bias voltage Vcc is grounded via between the collector and the emitter of the transistor 11. Therefore, the first gate of the VHF dual gate FET 202, which is connected to the VHF input terminal 302a of the VHF RF circuit 302 via the VHF RF amplifier selection line 21, is grounded. Meanwhile, the transistor 311 is on. Thus, the direct current bias voltage Vcc is applied to the first gate of the UHF dual gate FET 201 via the UHF/VHF switch line 314, and the UHF dual gate FET 201 becomes capable of performing the amplifying operation. As a result, the UHF dual gate FET 201 is selected.

Also in the above-described case in which the RF amplifier 20 not including a change-over switch is employed, the switching circuit 10 operates to attenuate the interference signal of the VHF high band by grounding the VHF input terminal 302a of the VHF RF circuit 302, when the UHF band is selected. When the UHF band is selected, therefore, it is possible to substantially attenuate the interference signal flowing into the UHF RF circuit 301, and thus to suppress the interference to the signal of the UHF band. Further, when the UHF band is selected, the first gate of the VHF dual gate FET 202 is grounded via the VHF RF amplifier selection line 21. Accordingly, the switching between the UHF dual gate FET 201 and the VHF dual gate FET 202 can be performed, even if the RF amplifier 20 does not include a change-over switch.

In the above description, a television signal is received in accordance with the UHF band and the VHF band. However, the present invention is not limited to the reception of a television signal in accordance with the UHF band and the VHF band, but is similarly applicable to the reception of a television signal in accordance with a first band and a second band of different frequency bands.

The present invention is applicable to a television tuner integrated circuit and a television tuner which receive a television signal in accordance with a first band and a second band.

What is claimed is:

1. A television tuner comprising:
an amplifier integrated circuit comprising, in a package:
a first amplifying element configured to amplify a television signal having a first band; and
a second amplifying element configured to amplify a television signal having a second band different from the first band; and
a television tuner integrated circuit connected to the amplifier integrated circuit as a subsequent stage of the amplifier integrated circuit, the television tuner integrated circuit comprising:
a first input terminal configured to receive the television signal of the first band output from the first amplifying element;
a second input terminal which is provided adjacently to the first input terminal, and configured to receive the television signal of the second band output from the second amplifying element;
a first high frequency circuit for the first band, an input terminal of which is connected to the first input terminal;
a second high frequency circuit for the second band, an input terminal of which is connected to the second input terminal; and
a switching element provided between the second input terminal and the ground, configured to ground the second input terminal if the television signal of the first band is received.

2. A television tuner comprising:
an amplifier integrated circuit including:
a first amplifying element configured to amplify a television signal having a first band; and
a second amplifying element configured to amplify a television signal having a second band different from the first band,
wherein the amplifier integrated circuit does not include a switching circuit for switching between the first and second amplifying elements; and
a television tuner integrated circuit comprising:
a first input terminal configured to receive the television signal of the first band output from the first amplifying element;
a second input terminal which is provided adjacently to the first input terminal, and configured to receive the television signal of the second band output from the second amplifying element, wherein the second input terminal is applied with a predetermined voltage capable of turning on the second amplifying element;
a first high frequency circuit for the first band, an input terminal of which is connected to the first input terminal;
a second high frequency circuit for the second band, an input terminal of which is connected to the second input terminal; and
a switching element provided between the second input terminal and the ground, configured to ground the second input terminal if the television signal of the first band is received,
wherein the amplifier integrated circuit is connected to the television tuner integrated circuit such that the second input terminal is connected to an input terminal of the second amplifying element in terms of direct current,
wherein, if the television signal of the second band is received, the predetermined voltage applied to the second input terminal is applied to the input terminal of the second amplifying element to turn on the second amplifying element, and
wherein, if the television signal of the first band is received, the input terminal of the second amplifying element is grounded to turn off the second amplifying element.

3. The television tuner according to claim 1, wherein the first band is an Ultra High Frequency band and the second band is a Very High Frequency band.

4. The television tuner according to claim 2, wherein the first band is an Ultra High Frequency band and the second band is a Very High Frequency band.

5. The television tuner according to claim 1, wherein the second input terminal is applied with a predetermined voltage capable of turning on the second amplifying element.

6. The television tuner according to claim 1, wherein the amplifier integrated circuit further comprises:
a switching circuit configured to select one of the first and second amplifying elements in accordance with a received band of the television signal.

7. The television tuner according to claim 1, wherein the switching element of the television tuner integrated circuit is not connected to any of the first input terminal, the first high frequency circuit, and the first amplifying element.

8. The television tuner according to claim 1, wherein the switching element of the television tuner integrated circuit is provided as an internal component of the television tuner integrated circuit.

9. A television tuner comprising:
an amplifier integrated circuit, including:
a first amplifying element for a first television signal having a first band; and
a second amplifying element for a second television signal having a second band different from the first band;
a tuning circuit configured to extract a channel-selected television signal, including:
a first tuning circuit for the first television signal, coupled to an output of the first amplifying element; and
a second tuning circuit for the second television signal, coupled to an output of the second amplifying element;
a television tuner integrated circuit configured to perform frequency conversion, including:
a first input terminal for the first television signal, coupled to an output of the first tuning circuit;
a second input terminal for the second television signal, coupled to an output of the second tuning circuit;
a first high frequency circuit for the first band, connected to the first input terminal;
a second high frequency circuit for the second band, connected to the second input terminal; and
a switching element coupled between the second input terminal and the ground, configured to switch the second input terminal to a ground if the first television signal is received, and to an ungrounded state if the second television signal is received.

10. The television tuner according to claim 9, wherein the first band is an Ultra High Frequency band and the second band is a Very High Frequency band.

11. The television tuner according to claim 9, wherein the switching element of the television tuner integrated circuit is not connected to any of the first input terminal, the first high frequency circuit, the first tuning circuit, and the first amplifying element.

12. The television tuner according to claim 9, wherein the switching element of the television tuner integrated circuit is provided as an internal component of the television tuner integrated circuit.

* * * * *